United States Patent [19]

Ishigaki

[11] Patent Number: 4,888,564

[45] Date of Patent: Dec. 19, 1989

[54] PHASE-LOCKED LOOP CIRCUIT

[75] Inventor: Yukinobu Ishigaki, Machide, Japan

[73] Assignee: Victor Company of Japan, Ltd., Japan

[21] Appl. No.: 266,115

[22] Filed: Nov. 2, 1988

[30] Foreign Application Priority Data

Nov. 6, 1987 [JP] Japan ................................ 62-280793
Nov. 18, 1987 [JP] Japan ................................ 62-291517
Nov. 18, 1987 [JP] Japan ................................ 62-291518

[51] Int. Cl.$^4$ ................................................ H03L 7/08

[52] U.S. Cl. ..................................... 331/1 A; 331/12; 331/21; 331/25; 375/120

[58] Field of Search ...................... 331/1 A, 10, 11, 12, 331/17, 18, 21, 25; 375/120

[56] References Cited

U.S. PATENT DOCUMENTS 3,571,743 3/1971 Menkes ................................ 331/11

*Primary Examiner*—David Mis

*Attorney, Agent, or Firm*—Andrus, Sceales, Starke & Sawall

[57] ABSTRACT

A PLL circuit having a function of a frequency multiplier comprises a phase detector circuit receiving an input signal, for producing an error signal which includes an alternating current component having a relatively high frequency depending on the frequency of a frequency-multiplied signal, a low pass loop filter, a voltage controlled oscillator, and a comparison signal generating circuit for generating N phase comparison signals. The phase detector circuit comprises a phase splitting circuit for generating from the input signal N phase split signals having respectively different N phases and N phase detectors for comparing the phases of the N phase split signals with different phases of the N phase comparison signal respectively.

6 Claims, 7 Drawing Sheets

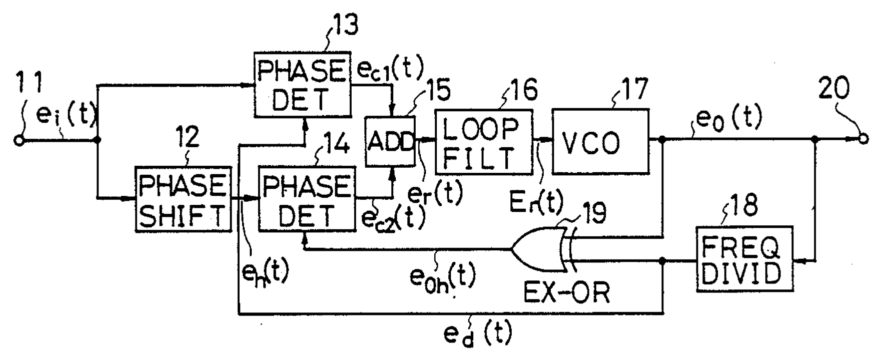
F I G. 1
11
$e_i(t)$
12
PHASE SHIFT
13
PHASE DET
$e_{c1}(t)$
14
PHASE DET
$e_{c2}(t)$
$e_h(t)$
15
ADD
$e_r(t)$
16
LOOP FILT
$E_r(t)$
17
VCO
$e_0(t)$
20
18
FREQ DIVID
19
EX-OR
$e_{0h}(t)$
$e_d(t)$
ωt
(A) $e_i(t)$
0
π/2
π
3π/2
2π
(B) $e_h(t)$
(C) $e_0(t)$
(D) $e_d(t)$
(E) $e_{0h}(t)$
(F) $e_{c1}(t)$
(G) $e_{c2}(t)$
(H) $e_r(t)$ FIG. 11
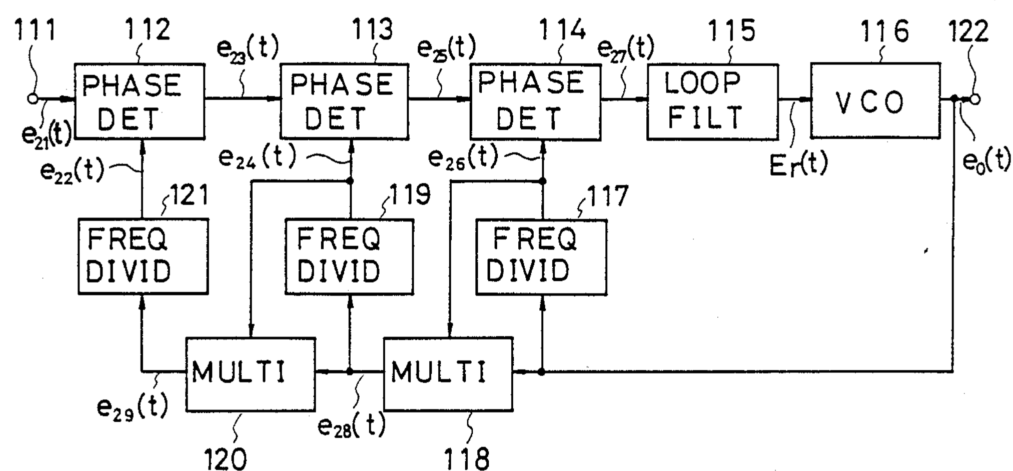
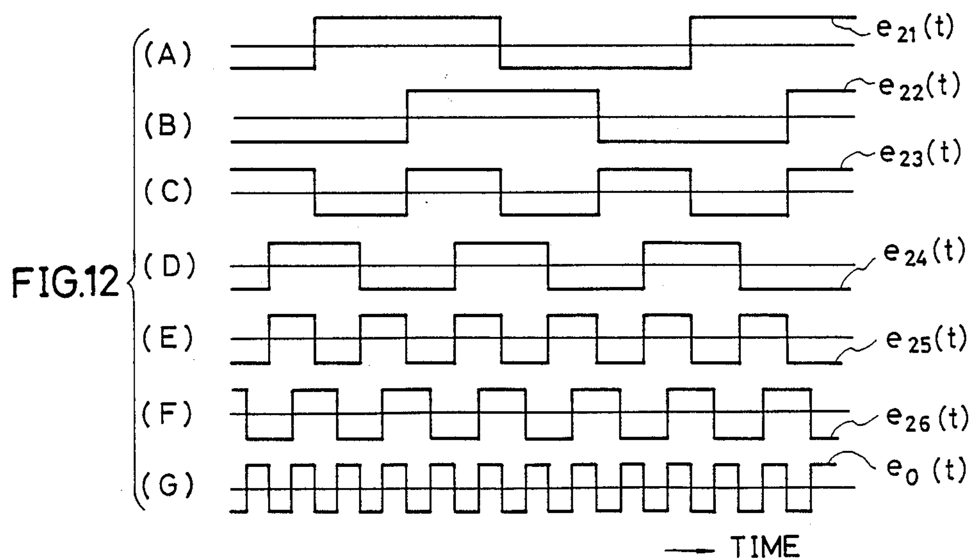

(A)
(B)
(C)
(D)
(E)
(F)
(G)
(H)
Δθ
e0(t)
e26(t)
e25(t)
e24(t)
e23(t)
e22(t)
e21(t)
e27(t)
T
T/2
TIME

PHASE-LOCKED LOOP CIRCUIT

BACKGROUND OF THE INVENTION

The present invention generally relates to phase-locked loop (PLL) circuits, and more particularly to a PLL circuit which has a function of a frequency multiplier and which can produce an output signal having little jitter.

Conventionally, in a PLL circuit having a function of a frequency multiplier, an input signal $e_i(t)$ is supplied to a phase detector, and the phase detector compares the phase of the input signal with the phase of an output signal $e_o(t)$ of a voltage controlled oscillator (VCO) which will be described later. The phase detector produces an error signal $e_r(t)$ and supplies it to a loop filter. The loop filter filters off the noise and higher frequency component in the error signal $e_r(t)$ to produce an error voltage Er. The error voltage Er is applied to the VCO as a control voltage to variably control the frequency and phase of an output oscillating signal $e_o(t)$ of the VCO.

The frequency of the oscillating signal $e_o(t)$ of the VCO is set to a predetermined value higher than the frequency of the input signal $e_i(t)$. The oscillating signal $e_o(t)$ is fed back to an input of the phase detector through a frequency divider on the one hand, and is supplied to an output terminal on the other hand.

A PLL circuit having a function of a frequency multiplier has a feedback loop constituted by the phase detector, the loop filter, the VCO, and the frequency divider functions as well known. Hence, the VCO supplies to the output terminal a signal $e_o(t)$ which has a phase synchronized with the phase of the input signal $e_i(t)$ and whose frequency is a multiplication of the frequency of the input signal $e_i(t)$ by a frequency dividing ratio of the frequency divider.

The error signal $e_r(t)$ is given by an equation.

$$e_r(t)=K_c(\theta_i(t)-K_d\theta_o(t)) \quad (1)$$

where Kc is the gain factor (expressed in volt/radian) of the phase detector, $\theta_i(t)$ is the phase of the input signal $e_i(t)$, Kd is the gain factor of the frequency divider, and $\theta_o(t)$ is the phase of the output signal $e_o(t)$ of the VCO.

The error signal $e_r(t)$ is converted into an error voltage $E_r$ by the loop filter. When the loop filter has a transfer function F(s) where s is a Laplace transform operator, $E_r(s)$, F(s) and $C_r(s)$ are related as follows.

$$E_r(s)=F(s)e_r(s) \quad (2)$$

The following equation is obtained by applying the Laplace transform to the equation (1).

$$e_r(s)=K_c(\theta_i(s)-K_d\theta_o(s)) \quad (3)$$

The output oscillating frequency of the VCO is controlled by the error voltage $E_r$, and the variation $\Delta\omega$ in the output oscillating frequency is given by $$\Delta\omega=K_oE_r \quad (4)$$

where $K_o$ is the gain factor of the VCO expressed in radian/volt second. Since the frequency is the time derivative of the phase, the equation (4) can be rewritten as $d\theta_o(t)/dt=K_oEr$. Hence, using the Laplace transform, the equation (2) is transformed into $$s\theta_o(s)=K_oEr(s). \quad (5)$$

From the equations (2), (3) and (5), the following equation is obtained by eliminating Er(s) and $e_r(s)$.

$$\theta_o(s)/\theta_i(s)=K_cK_oF(s)/(s+K_dK_cK_oF(s)) \quad (6)$$

$\theta_o(s)/\theta_i(s)$ shown in the equation (6) is the transfer function of the frequency multiplying circuit. The natural angular frequency $\omega_n$, dumping factor $\zeta$, lock range $\Delta\omega_L$ and capture range $\Delta\omega_C$ of the loop are known from $\theta_o(s)/\theta_i(s)$.

The bandwidth of the loop is determined by the loop gain and the cut-off frequency of the loop filter in accordance with the purpose of the loop.

PLL circuit of such a construction are widely used in various applications. For example, in transmitting data through a power line, a PLL circuit of the above-mentioned type is used as a frequency multiplier to produce a carrier signal having a phase synchronized with the phase of a power.

However, those conventional PLL circuits has a disadvantage that as the multiplying factor increases, a transitory phase error becomes larger in the output oscillating signal of the VCO. This transitory phase error is generally referred to as jitter.

The jitter is constituted mainly by the 1/f-noise caused by a transistor or transistors in the VCO. A part of 1/f-noise which has a frequency outside the bandwidth of the loop cannot be followed by the frequency following operation of the above-mentioned PLL, and causes the jitter to take place. For this reason, if the bandwidth of the loop is widened, the jitter is reduced.

However, when the bandwidth of the loop is widened, the PLL comes to follow an alternating current component (ripple component) of higher frequency in the error signal. In such a case, the VCO is sensitive to the above-mentioned alternating current component and produces an oscillating signal that appears to undergo an angular modulation.

For these reasons, in prior art, the bandwidth of the loop is set to a halfway width such that the jitter and the angular modulation are balanced

SUMMARY OF THE INVENTION

Accordingly, it is a general object of the present invention to provide a novel and useful PLL circuit having a function of a frequency multiplier in which the problems described heretofore are eliminated.

Another and more specific object of the present invention is to provide a PLL circuit having a function of a frequency multiplier in which an error signal produced by a phase detector has a frequency that is m times the frequency of an input signal which is supplied to the phase detector and is to be frequency-multiplied, where m is an integer equal to or larger than 2.

According to the circuit of the present invention, the bandwidth of the loop widens m times that in the conventional PLL circuit, and it is thus possible to reduce the jitter 1/m times or less compared with the conventional circuit. In the case where the level of the jitter is the same between the present invention and the prior art, the alternating current component of an error voltage in the present invention, which is supplied to the VCO, is lowered 1/m times or less that in the prior art thereby reducing the above-mentioned appearance of angular modulation.

Still another object of the present invention is to provide a PLL circuit having a function of a frequency multiplier in which an input signal is split at equal intervals within $\pi$ of phase to produce a plurality of phase split signals, a plurality of phase comparison signals are generated having respective phases $\pi/2$ shifted from the phase of the plurality of phase split signals, and a plurality of error signals are produced by comparing the phases of the phase split signals with the phases of the phase comparison signal and are summed up to supply a sum signal to a loop filter.

According to the circuit of the present invention, the frequency of the alternating current component in the error signal can be 8 times or more the frequency of the input signal without deteriorating basic characteristics of the PLL. As a consequence, the above-mentioned problems of jitter and angular modulation are substantially solved.

A further object of the present invention is provide a PLL circuit having a function of a frequency multiplier such that an input signal is supplied to a plurality of cascaded phase detectors so that respective signals are supplied to one inputs of the phase detectors, and a plurality of comparison signals are generated having respective phases $\pi/2$ shifted from the phases of the respective signals supplied to the one inputs of the phase detectors and are supplied to the other inputs of the phase detectors, respectively.

According to the circuit of the present invention, the cut-off frequency of the loop filter is multiplied by the frequency multiplying ratio of the circuit compared with the prior art without deteriorating basic characteristics of the PLL, thereby substantially reducing the jitter. In the case where the bandwidth of the loop is the same between the present invention and the prior art, frequencies at which the alternating component of the error signal has a low level in the present invention are higher than those in the prior art, thereby substantially solving the problems of the appearance of angular modulation.

Other objects and further features of the present invention will be apparent from the following detailed description when read in conjunction with the accompanying drawings.

BRIEF DESCRIPTION OF THE DRAWINGS

FIG. 1 is a system block diagram showing an embodiment of the PLL circuit according to the present invention;

FIG. 11 is a block diagram showing a third embodiment of the PLL circuit of the present invention;

FIG. 12 shows time charts for explaining the operation of the circuit shown in FIG. 11;

DETAILED DESCRIPTION

Figure 2:
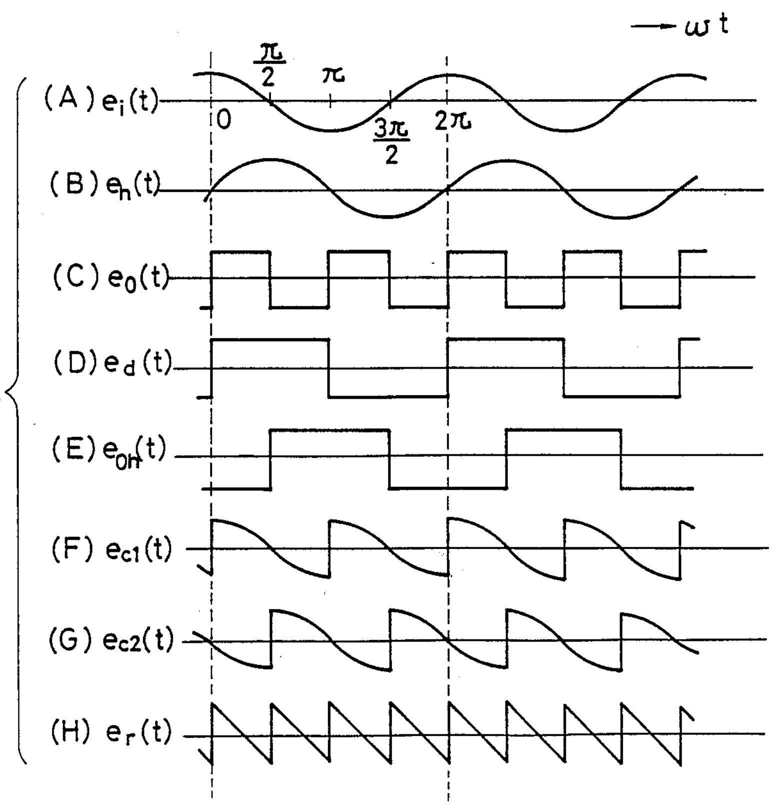
FIG. 2 shows time charts for explaining the operation of the circuit shown in FIG. 1.

In FIG. 1, an input signal $e_i(t)$ is supplied from an input terminal 11 to a phase detector 13 and a $\pi/2$-phase shifter 12, respectively. The $\pi/2$-phase shifter 12 produces an signal $e_h(t)$ and supplies it to the phase detector 14.

On the other hand, a VCO 17 produces a signal $e_o(t)$ which is supplied to the phase detector 13 through a $\frac{1}{2}$-frequency divider 18. The phase detector 13 compares the phase of th input signal $e_i(t)$ with the phase of a signal $e_d(t)$ produced by the $\frac{1}{2}$-frequency divider. An exclusive OR circuit 19 is supplied with the signal $e_o(t)$ from the VCO 17 and the signal $e_d(t)$ from the $\frac{1}{2}$-frequency divider, and produces a signal $e_{oh}(t)$ which is supplied to the phase detector 14. The phase detector 14 compares the phase of the signal $e_h(t)$ produced by the $\pi/2$-phase shifter with the phase of the signal $e_{oh}(t)$ produced by the exclusive OR circuit 19.

The phase detector 13 produces a signal $e_{c1}(t)$ and the phase detector 14 produces a signal $e_{c2}(t)$. An adding circuit 15 is supplied with the signal $e_{c1}(t)$ from the phase detector 13 and the signal $e_{c2}(t)$ from the phase detector 14, and adds the signals $e_{c1}(t)$ and $e_{c2}(t)$ to produce an error signal $e_r(t)$ which is supplied to a loop filter 16 following the adding circuit 15. The loop filter 16 filters out noises and a higher frequency component from the error signal $e_r(t)$ to convert the error signal $e_r(t)$ into an error voltage $E_r(t)$ which is supplied to the above-mentioned VCO 17.

This feedback loop produces at an output terminal 20 a signal $e_o(t)$ which has a phase synchronized with the phase of the input signal $e_i(t)$ and whose frequency is twice the frequency of the input signal $e_i(t)$.

When the input signal has a waveform described by $\cos\omega t$ as shown in FIG. 2(A), the signal $e_h(t)$ produced by the $\pi/2$-phase shifter has a waveform described by $\sin\omega t$.

As shown in FIG. 2(C), the signal $e_o(t)$ produced by the VCO 17 is a square wave having a repetitive frequency that is twice the frequency of the input signal $e_i(t)$. When the $\frac{1}{2}$-frequency divider 18 is supplied with the signal $e_o(t)$, the $\frac{1}{2}$-frequency divider 18 produces the signal $e_d(t)$ that has the following Fourier expansion.

$$e_d(t) = \frac{4}{\pi}\left(\sin\omega t + \frac{1}{3}\sin 3\omega t + \frac{1}{5}\sin 5\omega t + \dots\right) \quad (7)$$
$$= \frac{4}{\pi}\sum_{n=1}^{\infty}\frac{1}{2n-1}\sin(2n-1)\omega t$$

The signal $e_d(t)$ has a waveform as shown in FIG. 2(D).

On the other hand, the signal $e_{oh}(t)$ has the following Fourier expansion.

$$e_{oh}(t) = -\frac{4}{\pi}\left(\cos\omega t - \frac{1}{3}\cos 3\omega t + \frac{1}{5}\cos 5\omega t - \ldots\right) = -\frac{4}{\pi}\sum_{n=1}^{\infty}\frac{(-1)^{n+1}}{2n-1}\cos(2n-1)\omega t \quad (8)$$

The signal $e_{oh}(t)$ has a waveform as shown in FIG. 2(E).

The phase detectors 13 and 14 are of $\pm\pi/2$ type and each function equivalently as a balanced modulator or an analog multiplier.

Hence, the signal $e_{c1}(t)$ produced by the phase detector 13 has the following Fourier expansion.

$$e_{c1}(t) = e_i(t) \times e_d(t) = \frac{4}{\pi}\left(\frac{1}{3}\sin 2\omega t + \frac{1}{15}\sin 4\omega t + \frac{1}{35}\sin 6\omega t + \frac{1}{63}\sin 8\omega t + \ldots\right) = \frac{4}{\pi}\sum_{n=1}^{\infty}\frac{1}{4n^2-1}\sin 2n\omega t \quad (9)$$

The signal $e_{c1}(t)$ has a waveform as shown in FIG. 2(F).

The signal $e_{c2}(t)$ produced by the phase detector 14 has the following Fourier expansion.

$$e_{c2}(t) = e_i(t) \times e_{oh}(t) = -\frac{4}{\pi}\left(\frac{1}{3}\sin 2\omega t - \frac{1}{15}\sin 4\omega t + \frac{1}{35}\sin 6\omega t - \frac{1}{63}\sin 8\omega t + \ldots\right) = -\frac{4}{\pi}\sum_{n=1}^{\infty}\frac{(-1)^{n+1}}{4n^2-1}\sin 2n\omega t \quad (10)$$

The signal $e_{c2}(t)$ has a waveform as shown in FIG. 2(G).

The error signal $e_r(t)$ produced by the adding circuit 15 has the following Fourier-expansion.

$$e_r(t) = e_{c1}(\omega t) + e_{c2}(\omega t) = \frac{8}{\pi}\left(\frac{1}{15}\sin 4\omega t + \frac{1}{63}\sin 8\omega t + \frac{1}{143}\sin 12\omega t + \ldots\right) = \frac{8}{\pi}\sum_{n=1}^{\infty}\frac{1}{16n^2-1}\sin 4n\omega t \quad (11)$$

The signal $e_r(t)$ has a waveform as shown in FIG. 2(H).

As understood from the equation (11), in the present embodiment, the fundamental wave of the signal $e_r(t)$ is $\sin 4\omega t$ for $n=1$. Accordingly, the output of the phase detector in the PLL of the present invention has its fundamental frequency twice the fundamental frequency of the output of a phase detector in a PLL of the prior art, namely, four times the frequency of the input signal of the phase detector.

Figure 3:
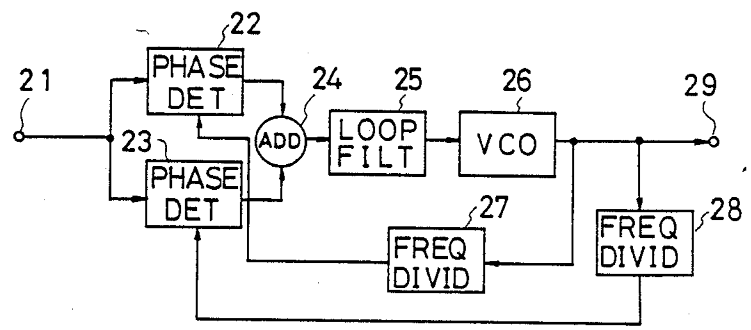
FIG. 3 is a block diagram illustrating the circuit shown in FIG. 1 in another way.
Figure 4:
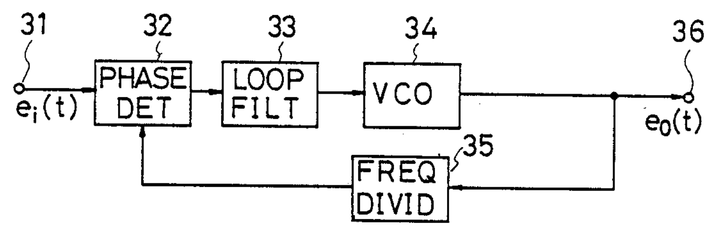
FIG. 4 is a block diagram of an equivalent circuit of the circuit shown in FIG. 3.

Turning to the operation of the loop shown in FIG. 1, FIG. 3 shown a construction equivalent to the arrangement shown in FIG. 1, and FIG. 4 shows an arrangement equivalent to that shown in FIG. 3. The phase detector 14 shown in FIG. 1 corresponds to a phase detector 23 shown in FIG. 3. The ½-frequency divider 18 corresponds to a ½-frequency divider 27 shown in FIG. 3. The exclusive OR circuit 19 shown in FIG. 1 corresponds to a ½-frequency divider 28 shown in FIG. 3.

In addition, the phase detectors 22 and 23 shown in FIG. 3 are represented by one phase detector 32 in FIG. 4, and the ½-frequency dividers 27 and 28 shown in FIG. 3 are represented by one ½-frequency divider 35 in FIG. 4. Accordingly, the circuit shown in FIG. 1 can be regarded as a circuit comprising an input terminal 31, the phase detector 32, a loop filter 33, a VCO 34, the ½-frequency divider 35 and an output terminal 36 as shown in FIG. 4.

Figure 14:
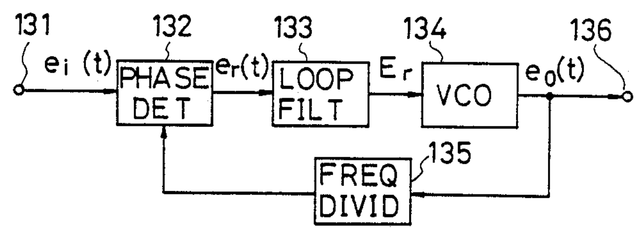
FIG. 14 is a block diagram showing an example of a conventional PLL circuit.

The above described conventional PLL circuit comprises an input terminal 131, a phase detector 132, a loop filter 133, a VCO 134, a frequency divider 135 and an output terminal as shown in FIG. 14. This means that the arrangement of the present embodiment shown in FIG. 3 is basically the same as the arrangement of the prior art circuit shown in FIG. 14.

However, unlike the prior art circuit, in the present embodiment, the error signal supplied to the loop filters 16, 25 and 33 has a frequency that is four times the frequency of the input signal $e_i(t)$ as understood from the equation (11). The frequency of the error signal in the present embodiment is twice the frequency of a prior art error signal supplied to the loop filter 133 in the conventional circuit. This prior art error signal is the same as the signal described by the equation (9). The present embodiment differs from the conventional circuit in this point.

For this reason, the present embodiment is different from the conventional circuit in that the gain factor $K_c$ of the phase detector is twice the gain factor in the conventional circuit, whereas the transfer function of the present embodiment is given by the same equation (6) as the conventional circuit. Accordingly, the basic characteristics of the present embodiment are identical to those of the conventional circuit. This means that design of circuitry using the present embodiment is similar to the design in the prior art because of the same transfer function described by the equation (6), and the dynamic characteristic of the circuit does not suffer from side effects.

In addition, since the loop filter 16 of the present embodiment is supplied with an error signal having a frequency that is twice the frequency of an error signal supplied to a loop filter in the conventional PLL circuit, the present embodiment has the following features. In the case where the amplitude of an alternating current component (ripple component) of the error signal is approximate to that of the conventional PLL circuit, the cut-off frequency of the filter 16 can be substantially doubled when compared with the conventional circuit so that the bandwidth of the loop widens twice. In this case, consequently, the jitter is reduced half or less compared with the conventional circuit.

The reason why the jitter can be reduced less than half the jitter of the conventional circuit is that the l/f-noise in a transistor of the VCO 17, which constitute a main part of the jitter, comprises components of different frequencies each having an amount that is not linearly proportional to the frequency of the component as well known, but the amount of component of the l/f-noise becomes greater as the frequency of component becomes lower.

According to the present embodiment, in the case where the extent of the jitter is approximate to the extent of the jitter of the conventional PLL circuit, that is, in the case where the bandwidth of the loop is approximate to the bandwidth of the loop in the conventional circuit, the loop filter 16 (having a cut-off frequency approximately equal to the cut-off frequency of the prior art) limits the frequency band of an error signal below the cut-off frequency to filter off higher frequency component. Accordingly, the alternating current component (ripple component) of an error signal is reduced to have approximately half the amplitude of an error signal according to the prior art. In this case, consequently, there is an improvement in the problem of angular modulation of the VCO's oscillating frequency output with the alternating current component (ripple component) of the error signal.

Figure 7:
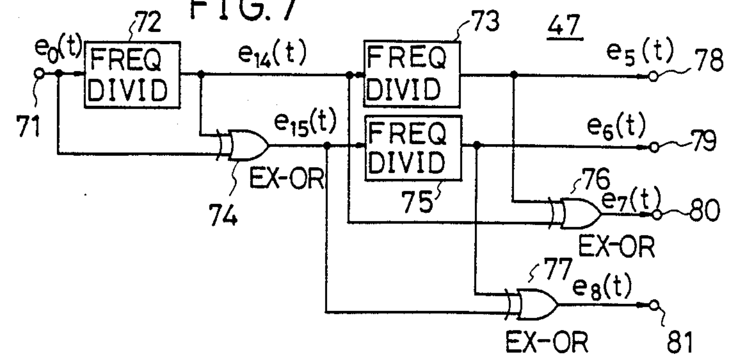
FIG. 7 is a circuit diagram showing another essential part of the circuit shown in FIG. 5.

Turning to a second embodiment of the PLL circuit of the present invention, in the second embodiment which is shown in FIG. 7, an input signal $e_1(t)$ to be frequency-multiplied is supplied from an input terminal 41 to a phase splitting circuit 42.

The input signal $e_1(t)$ is generally given by the equation $$e_1(t)=A\cos(\omega t+\theta_1(t)) \quad (12)$$

where A is a constant and $\theta_1(t)$ is a deviation component of the phase of the input signal. The input signal $e_1(t)$ has a waveform as shown in FIG. 8(A).

The phase splitting circuit 42 produces a plurality of signals having respective phases which are obtained by splitting the phase of the input signal at equal intervals within $\pi$ radians (=180°). In the present embodiment, the phase splitting circuit 42 has an arrangement shown in FIG. 6 and produces $e_1(t)$, $e_2(t)$, $e_3(t)$, and $e_4(t)$ parallely.

Figure 5:
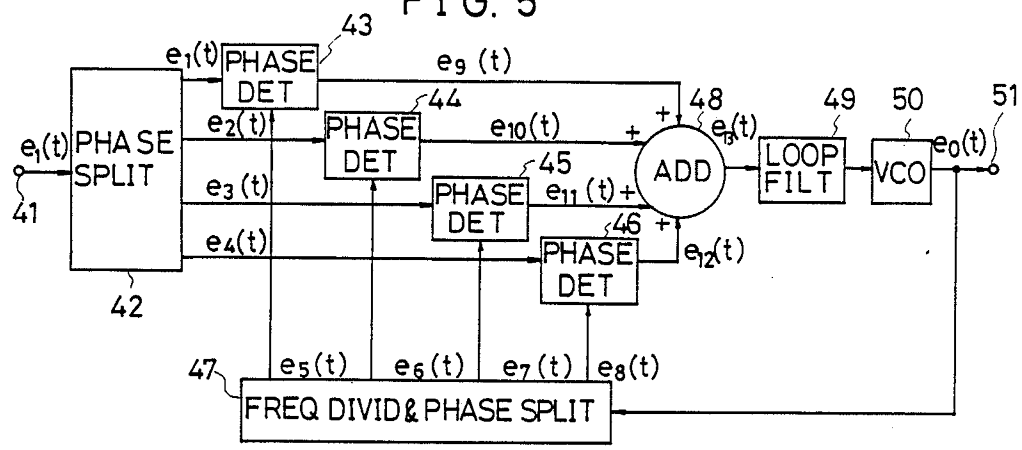
FIG. 5 is a block diagram showing a second embodiment of the PLL circuit of the present invention.
Figure 6:
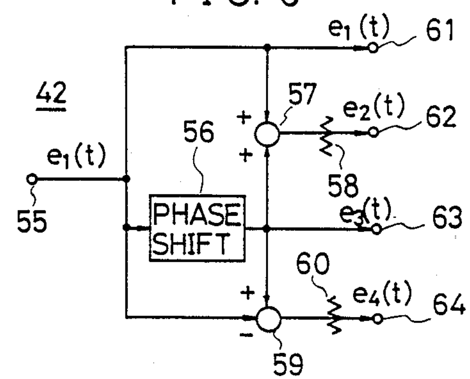
FIG. 6 is a circuit diagram showing an essential part of the circuit shown in FIG. 5.

An input terminal 55 shown in FIG. 6 corresponds to the input terminal 41 in FIG. 5. In FIG. 6, the input signal $e_1(t)$ from the input terminal 55 is supplied directly to an adding circuit 57 and a subtracting circuit 59 respectively, on the one hand, and is supplied through a $\pi/2$-phase shifter 56 to the adding circuit 57 and the subtracting circuit 59 respectively, on the other hand. In addition, the input signal $e_1(t)$ from the input terminal 55 is passed directly to an output terminal 61. The $\pi/2$-phase shifter 56 shifts the phase of the input signal $e_1(t)$ for $\pi/2$ radians (=90°) to produce a signal $e_3(t)$ and supply it to an output terminal 63.

The adding circuit 57 adds the signals $e_1(t)$ and $e_3(t)$ to produce a signal $e_2(t)$ whose phase is shifted from the signal $e_1(t)$ for $\pi/4$ radians (=45°). The subtracting circuit 59 subtracts the signal $e_1(t)$ from the signal $e_3(t)$ to produce a signal $e_4(t)$ whose phase is shifted from the signal $e_1(t)$ for $3\pi/4$ radians (=135°). The signals $e_2(t)$ and $e_4(t)$ are supplied to the output terminals 62 and 63 respectively after multiplying the levels of the signals with ½ by use of registors 58 and 60 for the purpose of level matching.

In four phase split signals $e_1(t)$ through $e_4(t)$ thus obtained, the signal $e_1(t)$ as an output signal is the same as the signal $e_1(t)$ as the input signal, and the signals $e_2(t)$, $e_3(t)$ and $e_4(t)$ are given by the following equations, respectively.

$$e_2(t) = A\cos\left(\omega t - \frac{\pi}{4} + \theta_1(t)\right) \quad (13)$$

-continued $$e_3(t) = A\cos\left(\omega t - \frac{\pi}{2} + \theta_1(t)\right) \quad (14)$$

$$e_4(t) = A\cos\left(\omega t - \frac{3}{4}\pi + \theta_1(t)\right) \quad (15)$$

The signals $e_2(t)$, $e_3(t)$ and $e_4(t)$ have waveforms as shown in FIGS. 8(B), (C) and (D), respectively.

Out of the output signals of the phase splitting circuit, the signal $e_1(t)$ is supplied to a multiplier type phase detector 43, the signal $e_2(t)$ is supplied to a multiplier type phase detector 44, the signal $e_3(t)$ is supplied to a multiplier type phase detector 45, and the signal $e_4(t)$ is supplied to a multiplier type phase detector 46. In the present embodiment, an integrated circuit (IC) of type No. 1494 can be used as the phase detectors 43–46.

On the other hand, a VCO 50 produces an signal $e_0$ and supplies it to a frequency dividing and phase splitting circuit 47 that is shown in FIG. 7. The frequency dividing and phase splitting circuit 47 produces a plurality of signals having different phases (signals having phases split at equal intervals within $\pi$ radians). In the present embodiment, the frequency dividing and phase splitting circuit 47 produces four signals $e_5(t)$, $e_6(t)$, $e_7(t)$, and $e_8(t)$ which have different phases and are generally given by equations $$e_5(t)=A\sin(\omega t+\theta_2(t)) \quad (16)$$

$$e_6(t)=A\sin(\omega t-{}_4\pi+\theta_2(t)) \quad (17)$$

$$e_7(t) = A\sin\left(\omega t - \frac{\pi}{2} + \theta_2(t)\right) \quad (18)$$

$$e_8(t) = A\sin\left(\omega t - \frac{3}{4}\pi + \theta_2(t)\right) \quad (19)$$

where $\theta_2(t)$ is a deviation component of the output signal of the VCO.

The signal $e_5(t)$ is supplied to the phase detector 43, the signal $e_6(t)$ is supplied to the phase detector 44, the signal $e_7(t)$ is supplied to the phase detector 45, and the signal $e_8(t)$ is supplied to the phase detector 46.

Accordingly, the phase detector 43 compares the phase of the signal $e_1(t)$ with the phase of the signal $e_5(t)$ by multiplying $e_1(t)$ with $e_5(t)$, and produce a signal $e_9(t)$ as a result of the phase comparison. The signal $e_9(t)$ is given by the following equation.

$$\begin{aligned} e_9(t) &= e_1(t) \times e_5(t) \\ &= \frac{A^2}{2}(\sin(2\omega t + \theta_1(t) + \theta_2(t)) - \\ &\sin(\theta_1(t) - \theta_2(t))) \end{aligned} \quad (20)$$

The phase detector 44 compares the phase of the signal $e_2(t)$ with the phase of the signal $e_6(t)$ by multiplying $e_2(t)$ with $e_6(t)$, and produce a signal $e_{10}(t)$ as a result of the phase comparison. The signal $e_{10}(t)$ is given by the following equation.

$$e_{10}(t) = e_2(t) \times e_6(t) = \frac{A^2}{2}\left(\sin\left(2\omega t - \frac{\pi}{2} + \theta_1(t) + \theta_2(t)\right) - \sin(\theta_1(t) - \theta_2(t))\right) \quad (21)$$

The phase detector 45 compares the phase of the signal $e_3(t)$ with the phase of the signal $e_7(t)$ by multiplying $e_3(t)$ with $e_7(t)$, and produce a signal $e_{11}(t)$ as a result of the phase comparison. The signal $e_{11}(t)$ is $$e_{11}(t) = e_3(t) \times e_7(t) = \frac{A^2}{2}(\sin(2\omega t - \pi + \theta_1(t) + \theta_2(t)) - \sin(\theta_1(t) - \theta_2(t))) \quad (22)$$

The phase detector 46 compares the phase of the signal $e_4(t)$ with the phase of the signal $e_8(t)$ by multiplying $e_4(t)$ with $e_8(t)$, and produce a signal $e_{12}(t)$ as a result of the phase comparison. The signal $e_{12}(t)$ is given by the following equation.

$$e_{12}(t) = e_4(t) \times e_8(t) = \frac{A^2}{2}\left(\sin\left(2\omega t - \frac{3}{2}\pi + {}_1(t) + \theta_2(t)\right) - \sin(\theta_1(t) - \theta_2(t))\right) \quad (23)$$

A summing circuit 48 are supplied with the signals $e_9(t)$ through $e_{12}(t)$ from the phase detectors 43 through 46 and sums up the signals $e_9(t)$ through $e_{12}(t)$ to produce a signal $e_{13}(t)$ that is given by the following equation.

$$\begin{aligned} e_{13}(t) &= e_9(t) + e_{10}(t) + e_{11}(t) + e_{12}(t) \\ &= -\frac{4}{2}A^2\sin(\theta_1(t) - \theta_2(t)) \\ &= -2A^2\sin(\theta_1(t) - \theta_2(t)) \end{aligned} \quad (24)$$

This means that the signal $e_{13}(t)$ is a positive or negative error signal.

Since $\theta_1(t)-\theta_2(t)$ is relatively small, $e_{13}(t)$ can be rewritten as $$e_{13}(t) \approx -2A^2(\theta_1(t) - \theta_2(t)). \quad (25)$$

In addition, if $\theta_1(t)=\theta_2(t)$, the following equation is obtained from the equation (24).

$$e_{13}(t)=0 \quad (26)$$

This equation means that the error signal $e_{13}(t)$ to be supplied to a loop filter 49 is a direct current.

The loop filter 49 is supplied with the error signal $e_{13}(t)$ and filters off a higher frequency component of the error signal $e_{13}(t)$ to produce an error voltage. The error voltage produced by the loop filter is applied to the VCO 50 as a control voltage to variably control the output oscillating frequency of the VCO 50. The signal $e_0(t)$ produced by the VCO has a waveform as shown in FIG. 8(E) and is a pulse series which has a phase synchronized with the phase of the input signal $e_1(t)$ and has a repetitive frequency that is four times the frequency of the input signal $e_1(t)$. The signal $e_0(t)$ is supplied to an output terminal 51 on the one hand, and is supplied to the frequency dividing and phase splitting circuit 47 on the other hand.

The above description is made for explaining the basic principle of the present embodiment, and refers to the output signals $e_5(t)$ through $e_8(t)$ of the frequency dividing and phase splitting circuit 47, the output signals $e_9(t)$ through $e_{12}(t)$ of the phase detectors 43 through 46, and the output signal $e_{13}(t)$ of the adding circuit 48 as analog signals.

However, it is practically difficult for the frequency dividing and phase splitting circuit 47 to split the phase of an analog signal to a plurality of phases. Hence, in the present embodiment, a plurality of digital signals of different phases are produced by an arrangement shown in FIG. 7.

The arrangement shown in FIG. 7 comprises ½-frequency dividers 72, 73 and 75, and exclusive OR circuits 74, 76 and 77. Accordingly, the undermentioned signals of different phases are supplied to the output terminals 78, 79, 80 and 81.

Two ½-frequency dividers 72 and 73 devide one fourth the frequency of the signal $e_0(t)$ produced by the VCO 50 to produce a signal as the signal $e_5(t)$ and supplies the signal $e_5(t)$ thus produced to the output terminal 78. The signal $e_5(t)$ has a waveform shown in FIG. 8(G).

At the output terminal 39, there is supplied as the signal $e_6(t)$ a signal having a phase shifted from the phase of the signal $e_5(t)$ for $\pi/4$ radians. The signal $e_6(t)$ has a waveform shown in FIG. 8(I).

At the output terminal 40, there is supplied as the signal $e_7(t)$ a signal having a phase shifted from the phase of the signal $e_6(t)$ for $\pi/4$ radians. The signal $e_7(t)$ has a waveform shown in FIG. 8(J).

At the output terminal 41, there is supplied as the signal $e_8(t)$ a signal having a phase shifted from the phase of the signal $e_7(t)$ for $\pi/4$ radians. The signal $e_8(t)$ is shown in FIG. 8(K).

A signal $e_{14}(t)$ produced by the ½-frequency divider 72 has a waveform shown in FIG. 8(F), and a signal $e_{15}(t)$ produced by the exclusive OR circuit 74 has a waveform shown in FIG. 8(H).

Under these circumstances, the signals $e_9(t)$, $e_{10}(t)$, $e_{11}(t)$ and $e_{12}(t)$ produced by the phase detectors 43, 44, 45 and 46 are square waves as shown in FIGS. 8(L), 8(M), 8(N) and 8(O), respectively. The signal $e_{13}(t)$ produced by the summing circuit 48 has a waveform shown in FIG. 8(P) and has a repetitive frequency that is 8 times the frequency of the input signal $e_1(t)$.

Figure 8:
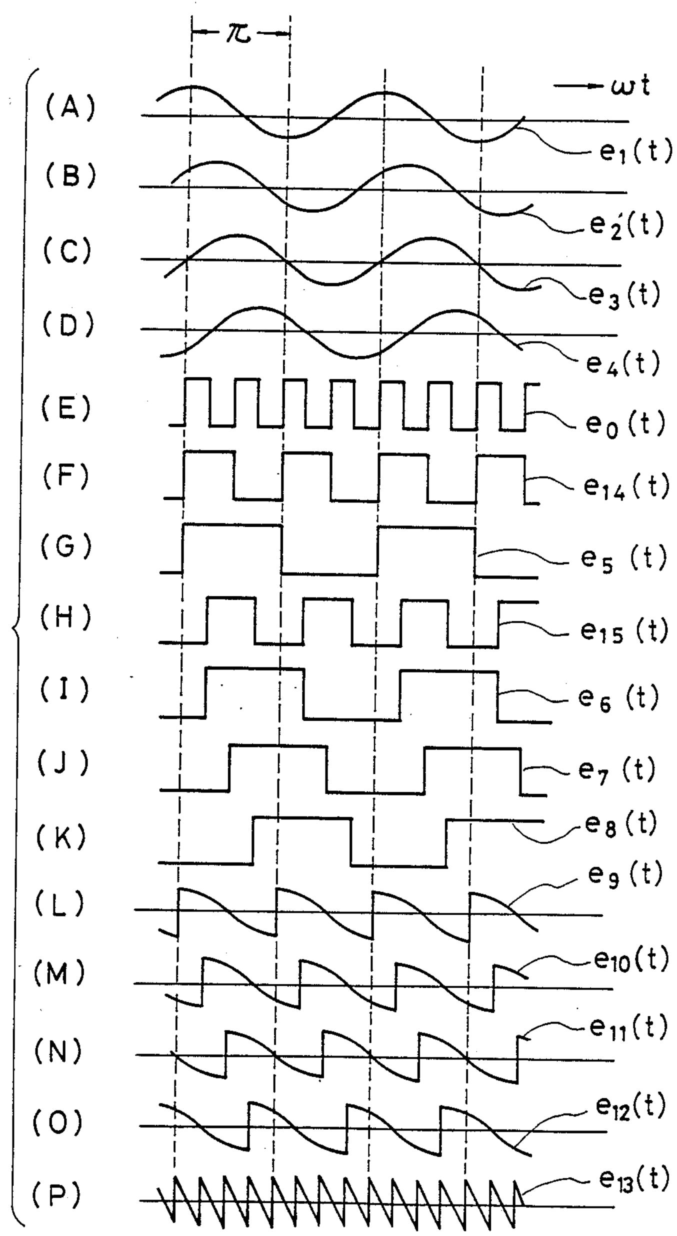
FIG. 8 shows time charts for explaining the operation of the circuit shown in FIGS. 5–7.

FIG. 8 shows signals in the case of $\theta_1(t)=\theta_2(t)$.

When an analog multiplier type phase detector has one or both input supplied with a digital signal or digital signals as in the above described embodiment, the error signal has a frequency that is a multiplication of the frequency of an input signal. In the present embodiment, four phases are composed to produce an error signal having a frequency 8 times the frequency of the input signal $e_1(t)$.

Figure 9:
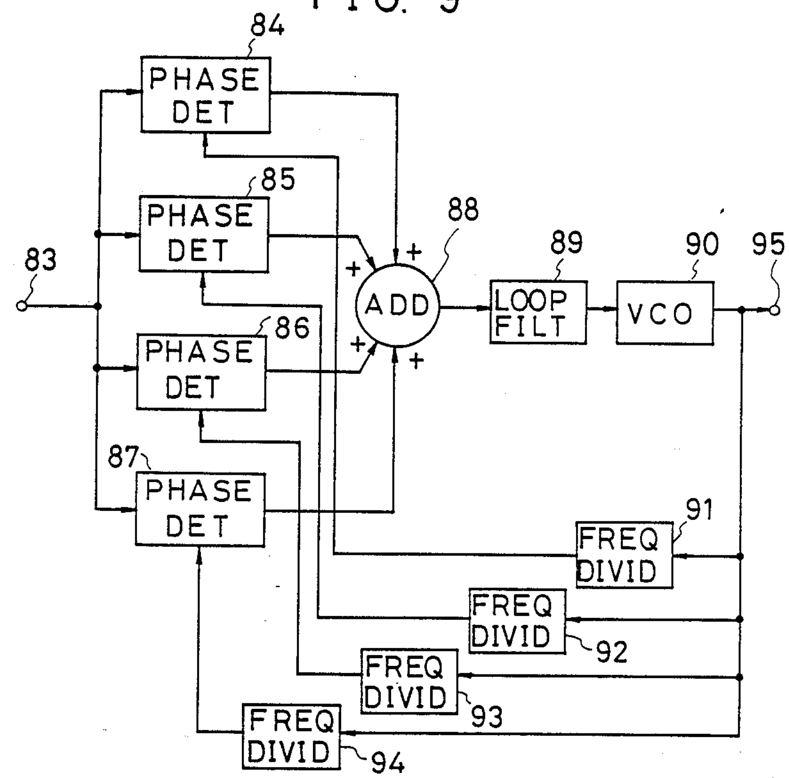
FIG. 9 is a block diagram illustrating the circuit shown in FIG. 5 in another way.
Figure 10:
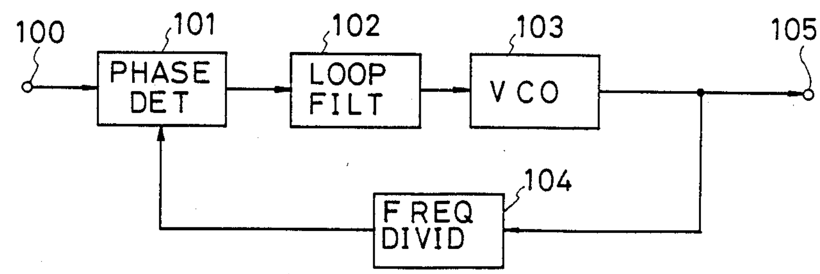
FIG. 10 is a block diagram of an equivalent circuit of the circuit shown in FIG. 9.

Turning to the description of the basic operation of the present embodiment, the arrangements shown in FIGS. 5, 6 and 7 correspond to arrangements shown in FIGS. 9 and 10.

In FIG. 9, a signal from an input terminal 83 is parallely supplied to four phase detectors 84, 85, 86 and 87, respectively.

On the other hand, a VCO 90 produces a signal and supplies it parallely to the phase detectors 84, 85, 86 and 87 through four ¼-frequency dividers 91, 92, 93 and 94, respectively.

Each phase detector 84, 85, 86 and 87 carries out a phase comparison of supplied signals by the multiplication of the supplied signals, and produce a signal as a result of the phase comparison. A summing circuit 88 is supplied with the signals from the phase detectors and sums up the signals to produce a signal which is applied through a loop filter 89 to a VCO 90 as an error voltage. The output signal of the VCO is output from an output terminal on the one hand, and is parallely supplied to the four ¼-frequency dividers 91, 92, 93 and 94 as described above, on the other hand.

FIG. 10 is a redrafted diagram of the frequency multiplying circuit shown in FIG. 9. A phase detector shown in FIG. 10 corresponds to a circuit part in FIG. 9 comprising the phase detectors 84 through 87 and the summing circuit 88. A loop filter 102 shown in FIG. 10 corresponds to the loop filter 89 shown in FIG. 9. A VCO 103 shown in FIG. 10 corresponds to the VCO 90 shown in FIG. 9. A ¼-frequency divider 104 shown in FIG. 10 representatively corresponds to the four ¼-frequency dividers 91–94 shown in FIG. 9.

The system block diagram shown in FIG. 10 shows a construction similar to the conventional frequency multiplying circuit shown in FIG. 14. However, the present embodiment differs from the conventional circuit in that an error signal supplied to the loop filter 102 has a frequency that is 8 times the frequency of an input signal. In the conventional frequency multiplying circuit having the PLL, the output signal of the frequency divider 135 and the input signal are phase-compared irrespective of frequency multiplying factors as shown in FIG. 14, whereas in the frequency multiplying circuit having the multiplier type phase detector 132, an error signal includes an alternating current component (ripple component) having a frequency that is twice the frequency of an input signal $e_i(t)$.

Consequently, the transfer function of the present embodiment is given by the equation (6), too. The present embodiment has the same basic characteristics as the conventional frequency multiplying circuit having the PLL, and has advantages similar to those of the first embodiment.

Turning to a third embodiment of the present invention shown in FIG. 11, an input signal $e_{21}(t)$ to be frequency-multiplied is supplied from an input terminal 111 to a phase detector 112. The phase detector 112 is cascaded with other phase detectors 113 and 114. The phase detectors 112, 113 and 114 are of analog multiplier type.

The input signal $e_{21}(t)$ is a symmetrical square wave as shown in FIG. 12(A) and has a fundamental wave given by the equation (12). In this respect, all the signals produced at various parts in the present embodiment are square waves as shown in FIGS. 12(A) through 12(G). However, for convenience' sake, description will be given primarily referring to equations of fundamental waves of the signals.

The phase detector 112 compares the phase of the input signal $e_{21}(t)$ with the phase of a signal $e_{22}(t)$ provided by a ½-frequency divider 121 which will be described later. The signal $e_{22}(t)$ is shown in FIG. 12(B) and has a fundamental wave described by an equation $$e_{22}(t)=A\cos(\omega t-{}_{2}{}^{\omega}+\theta_2(t)) \tag{27}$$

where A is a constant.

This equation means that the phase of the signal $e_{22}(t)$ is shifted from the input signal $e_{21}(t)$ for $\pi/2$ radians. Accordingly, the analog multiplier type phase detector 112 produces a signal $e_{23}(t)$ described by an equation $$\begin{aligned} e_{23}(t) &= e_{21}(t) \times e_{22}(t) \\ &= B\left(\cos\left(\frac{\pi}{2}+\theta_1(t)-\theta_2(t)\right)+\right. \\ &\qquad \left.\cos\left(2\omega t-\frac{\pi}{2}+\theta_1(t)+\theta_2(t)\right)\right) \end{aligned} \tag{28}$$

where B is a constant.

The signal $e_{23}(t)$ has a waveform shown in FIG. 12(C). The signal $e_{23}(t)$ is supplied to the analog multiplier type phase detector 113 which follows the phase detector 112.

A signal $e_{24}(t)$ to be phase-compared with the signal $e_{23}(t)$ has a phase shifted from the phase of the signal $e_{23}(t)$ for $\pi/2$ radians as shown in FIG. 12(D). In other words, the fundamental wave of the signal $e_{24}(t)$ is given by the following equation.

$$e_{24}(t)=A\cos(2\omega t-\pi+2\theta_2(t)) \tag{29}$$

Accordingly, the phase detector 113 produces a signal $e_{25}(1)$ given by an equation $$\begin{aligned} e_{25}(t) &= e_{23}(t) \times e_{24}(t) \\ &= C\left(\cos\left(-2\omega t+\frac{3}{2}\pi+\theta_1(t)-3\theta_2(t)\right)+\right. \\ &\qquad \cos\left(2\omega t-\frac{\pi}{2}+\theta_1(t)+\theta_2(t)\right)+ \\ &\qquad \cos\left(\frac{\pi}{2}+\theta_1(t)-\theta_2(t)\right)+ \\ &\qquad \left.\cos\left(4\omega t-\frac{3}{2}\pi+\theta_1(t)+3\theta_2(t)\right)\right) \end{aligned} \tag{30}$$

where C is a constant. The signal $e_{25}(t)$ described by the equation (30) has a waveform shown in FIG. 12(E). The signal $e_{25}(t)$ is supplied to the analog multiplier type phase detector 114 which follows the phase detector 113.

A signal $e_{26}(t)$ to be phase-compared with the signal $e_{25}(t)$ has a phase shifted from the phase of the signal $e_{25}(t)$ for $\pi/2$ radians as shown in FIG. 12(F). In other words, the fundamental wave of the signal $e_{26}(t)$ is given by the following equation.

$$e_{26}(t)=A\cos(4\omega t-2+4\theta_2(t)) \tag{31}$$

Accordingly, the phase detector 114 produces a signal $e_{27}(t)$ described by an equation $$e_{27}(t) = e_{25}(t) \times e_{26}(t) \tag{32}$$

$$= D\Big(\cos\Big(-6\omega t + \frac{7}{2}\pi + \theta_1(t) - 7\theta_2(t)\Big) + \cos\Big(2\omega t - \frac{\pi}{2} + \theta_1(t) + \theta_2(t)\Big) + \cos\Big(-2\omega t + \frac{3}{2}\pi + \theta_1(t) - 3\theta_2(t)\Big) + \cos\Big(6\omega t - \frac{5}{2}\pi + \theta_1(t) + 5\theta_2(t)\Big) + \cos\Big(-4\omega t + \frac{5}{2}\pi + \theta_1(t) - 5\theta_2(t)\Big) + \cos\Big(4\omega t - \frac{3}{2}\pi + \theta_1(t) + 3\theta_2(t)\Big) + \cos\Big(\frac{\pi}{2} + \theta_1(t) - \theta_2(t)\Big) + \cos\Big(8\omega t - \frac{7}{2}\pi + \theta_1(t) + 7\theta_2(t)\Big)\Big)$$

where D is a constant. As understood from the equation (32), the signal $e_{27}(t)$ includes components of frequencies which are from two to eight times the frequency of the input signal. The inclusion of higher harmonics is caused by the independence of the deviation component $\theta_1(t)$ of the input signal and the deviation component $\theta_2(t)$ of the output signal of the VCO. Hence, if $\theta_1(t)=\theta_2(t)$, the equation (32) includes only the term regarding $8\omega t$. This means that the frequency of the input signal is multiplied by eight to become the error signal.

The signal $e_{27}(t)$ produced by the analog multiplier type phase comparator 114 is supplied to a loop filter 115 that follows the phase comparator 114. The loop filter 115 filters off an alternating current component (ripple component) such as the input signal and the VCO's output signal to produce an error voltage Er(t) which is supplied to a VCO 116.

It is understood from the seventh term of the equation (32) that the error voltage $E_r(t)$ is given by an equation $$E_r(t) = D\cos\Big(\frac{\pi}{2} + \theta_1(t) - \theta_2(t)\Big). \tag{33}$$

However, since the difference between the phase deviations $\frac{1}{4}_1(t)$ and $\frac{1}{4}_2(t)$ is relatively small, $E_r(t)$ can be rewritten as $$E_r(t) \simeq -D(\tfrac{1}{4}_1(t) - \tfrac{1}{4}_2(t)) \tag{34}$$

The VCO 116 produces a signal $e_0(t)$ having a waveform shown in FIG. 12(G). The signal $e_0(t)$ is frequency-divided by a ½-frequency divider 117 to produce an output signal having a waveform shown in FIG. 12(F). The output signal of the ½-frequency divider is the above-mentioned signal $e_{26}(t)$.

The signals $e_0(t)$ and $e_{26}(t)$ are supplied to an analog multiplier 118 where the signals are multiplied to produce a signal $e_{28}(t)$. The signal $e_{28}(t)$ is frequency-divided by a ½-frequency divider 119 to produce an output signal having a waveform shown in FIG. 12(D). The output signal of the ½-frequency divider 119 is the above-mentioned signal $e_{24}(t)$.

The signals $e_{24}(t)$ and $e_{26}(t)$ are supplied to an analog multiplier 120 where the signals are multiplied to produce a signal $e_{29}(t)$. The signal $e_{29}(t)$ is frequency-divided by a ½-frequency divider to produce an output signal having a waveform shown in FIG. 12(B). The output signal of the ½-frequency divider 121 is the above-mentioned signal $e_{22}(t)$.

Figure 13:
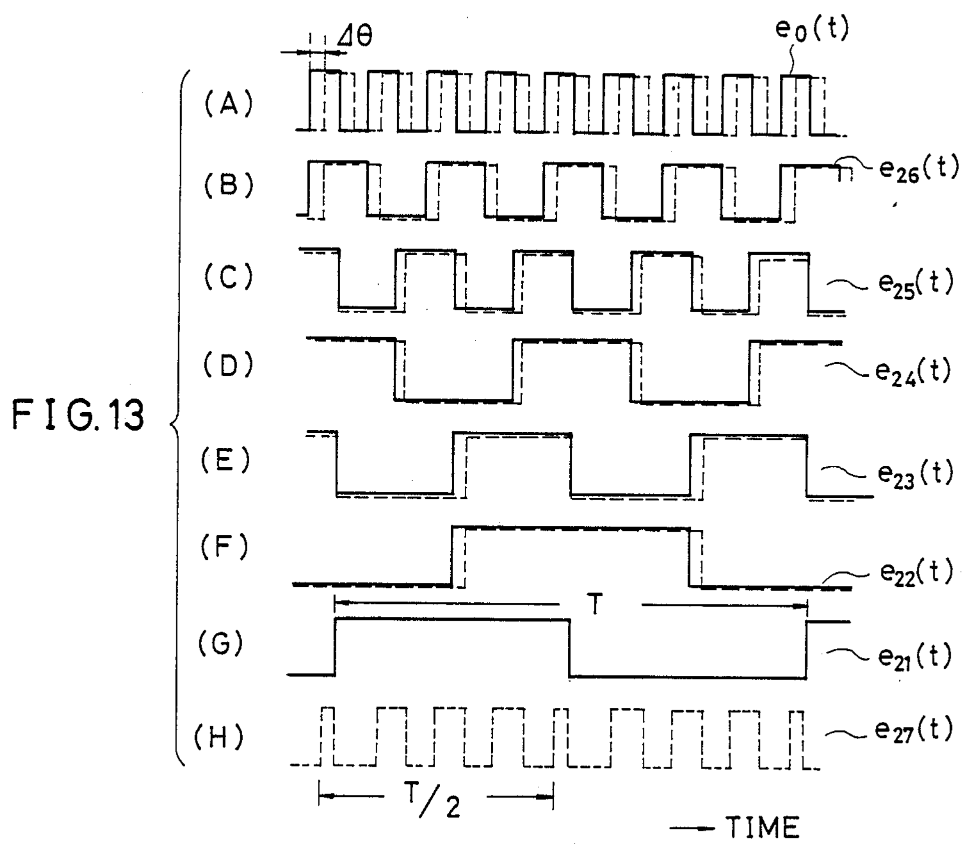
FIG. 13 show time charts for explaining the operation of the circuit shown in FIG. 11 when the output signal of the circuit is deviated for $\Delta\theta$.

Referring to FIGS. 11 and 13, description will be given on operation of the loop in the case where the output signal $e_0(t)$ of the VCO has a phase shifted for $\Delta\theta$.

FIG. 13(A) shows the waveform of the signal $e_0(t)$ that is output by the VCO 116 to an output terminal 122. The signal $e_0(t)$ has a frequency 8 time the frequency of the input signal. FIG. 13(B), 13(C), 13(D), 13(E), 13(F), and 13(G) show respectively the waveforms of the above-mentioned signals $e_{26}(t)$, $e_{25}(t)$, $e_{24}(t)$, $e_{23}(t)$, $e_{22}(t)$, and $e_{21}(t)$.

When the signal $e_0(t)$ has a waveform plotted with a solid line, the signals $e_{26}(t)$, $e_{25}(t)$, $e_{24}(t)$, $e_{23}(t)$, $e_{22}(t)$, and $e_{21}(t)$ have waveforms plotted with solid lines in FIGS. 13(B) through 13(G), respectively. When the phase of the signal $e_0(t)$ is shifted for $\Delta\theta$ as plotted with a broken line, the respective phases of the signals $e_{26}(t)$, $e_{25}(t)$, $e_{24}(t)$, $e_{23}(t)$, $e_{22}(t)$, and $e_{21}(t)$ are shifted as plotted with broken lines.

The phase shift of $\Delta\theta$ causes the error signal $e_{27}(t)$ to have a waveform shown FIG. 13(H). In other words, the error signal $e_{27}(t)$, which is supplied to the loop filter 115, has a period T/2 that is half the period T of the input signal $e_{21}(t)$ as shown in FIG. 13(H). The period T/2 is the same as a phase shift caused by a PLL including one phase detector. In other words, according to the present embodiment, the phase shift is not accumulated irrespective of that the PLL includes a plurality of phase detectors.

As in the first and second embodiments, the present embodiment has also the same transfer function and the same basic operations as the conventional frequency multiplying circuit having the PLL, and are advantageous in that the jitter or the appearance of angular modulation are substantially reduced. In the present embodiment, since the alternating current component (ripple component) of the error signal has a frequency that is 8 times the frequency of the input signal, the factor $K_c$ in the equation has a value 4 times the factor $K_c$ of the conventional circuit.

When N phase detectors are cascaded between the input terminal and the loop filter 115, where N is an integer equal to or larger than 2, a signal produced by the VCO 116 has a fundamental frequency that is $2^N$ times the frequency of the input signal.

The fundamental frequency of the signal produced by the VCO 116 is the same as the fundamental frequency of an error signal which is supplied to the loop filter 114. When the above-mentioned $\frac{1}{4}_1(t)$ and $\frac{1}{4}_2(t)$ are identical, the error signal includes only a component of the fundamental frequency, which is $2^N$ times the frequency of the input signal.

The present invention is advantageous to the application in PLLs of a high multiplying factor and is fairly distinguishable from the conventional circuit.

In the embodiment described hereinbefore, analog multipliers are used as phase detectors. However, when the input signal and the output signal of the VCO are digital signals, those analog multipliers can be replaced by exclusive OR circuits.

What is claimed is:

1. A phase-locked loop circuit for multiplying a frequency of an input signal by m to produce a frequency-multiplied signal, where m is an integer equal to or larger than 2, said phase-locked loop circuit comprising:

phase detector means being supplied with said input signal and N phase comparison signals having respectively different N phases and comprising a phase splitting circuit for generating from said input signal N phase split signals having respectively different N phases and N phase detectors for comparing the phases of said N phase split signals with the phases of said N phase comparison signals respectively to produce an error signal of which an alternating current component has a frequency depending on a frequency of said frequency-multiplied signal, where N is an integer equal to or larger than 2:

a loop filter supplied with said error signal from said phase detector means, for filtering off a higher frequency component of said error signal to produce an error voltage;

a voltage controlled oscillator supplied with said error voltage from said loop filter as a control voltage, for producing an oscillating signal as said frequency-multiplied signal, said oscillating signal having a frequency variably controlled depending on said error voltage; and comparison signal generating means supplied with said oscillating signal from said voltage controlled oscillator, for generating said N phase comparison signals.

2. A phase-locked loop circuit for multiplying a frequency of an input signal by m to produce a frequency-multiplied signal, where m is an integer equal to or larger than 2, said phase-locked loop circuit comprising:

phase detector means being supplied with said input signal and N phase comparison signals and comprising N phase detectors for comparing a phase of said input signal with phases of said N phase comparison signals to produce an error signal which includes an alternating current component having a frequency depending on a frequency of said frequency-multiplied signal, where N is an integer equal to or larger than 2;

a loop filter supplied with said error signal from said phase detector means, for filtering off a higher frequency component of said error signal to produce an error voltage;

a voltage controlled oscillator supplied with said error voltage from said loop filter as a control voltage, for producing an oscillating signal as said frequency-multiplied signal, said oscillating signal having a frequency variably controlled depending on said error voltage; and comparison signal generating means supplied with said oscillating signal from said voltage controlled oscillator, for generating said N phase comparison signals, said N phase detectors being cascaded between an input terminal of said frequency multiplying circuit for receiving said input signal and an input of said loop filter for receiving said error signal so that each phase detector has one input connected to said input terminal of said frequency multiplying circuit or to an output of an immediately preceding phase detector out of said N phase detectors; said comparison signal generating means being supplied with said frequency-multiplied signal and generating N phase comparison signals each of which is supplied to another input of a corresponding phase detector out of said N phase detectors and which has a fundamental wave of the same frequency as a signal supplied to said one input of said corresponding phase detector and has a phase shifted for $\pi/2$ radians from a phase of said signal supplied to said one input of said corresponding phase detector; and m being equal to $2^N$ and the alternating current component of said error signal being a fundamental frequency that is the same as the frequency of said frequency-multiplied signal.

3. A phase-locked loop circuit as claimed in claim 2 in which said comparison signal generating means comprises (N-1) multipliers which are cascaded, and N $\frac{1}{2}$-frequency dividers provided correspondingly for said N phase detectors, for generating said N phase comparison signals, (N-1) $\frac{1}{2}$-frequency dividers out of said N $\frac{1}{2}$-frequency divider other than a predetermined one $\frac{1}{2}$-frequency divider respectively corresponding to said (N-1) multipliers; a trailing multiplier of said (N-1) multipliers supplies an output signal to said predetermined one $\frac{1}{2}$-frequency divider and said predetermined one $\frac{1}{2}$-frequency divider supplies an output signal to a leading phase detector of said N phase detectors as the phase comparison signal; each $\frac{1}{2}$-frequency divider of said (N-1) $\frac{1}{2}$-frequency dividers is supplied with the same signal as a signal supplied to one input of a corresponding multiplier and supplies an output signal to a corresponding phase detector as the phase comparison signal and to another input of said corresponding multiplier.

4. A phase-locked loop circuit for multiplying a frequency of an input signal by m to produce a frequency-multiplied signal, where m is an integer equal to or larger than 2, said phase-locked loop circuit comprising:

phase detector means being supplied with said input signal and N phase comparison signals to produce an error signal which includes an alternating current component having a frequency depending on a frequency of said frequency-multiplied signal, said phase detector means comprising a phase splitting circuit for generating N first phase split signals which have respectively N phases, where N is an integer equal to or larger than 2, said N phases being obtained by splitting the phase of said input signal at equal intervals within $\pi$ radians, N phase detectors for respectively comparing phases of said N phase comparison signals with the phases of said N first phase split signals, and a summing circuit for summing up output signals of said N phase detectors to produce said error signal;

a loop filter supplied with said error signal from said phase detector means, for filtering off a higher frequency component of said error signal to produce an error voltage;

a voltage controlled oscillator supplied with said error voltage from said loop filter as a control voltage, for producing an oscillating signal as said frequency-multiplied signal, said oscillating signal having a frequency variably controlled depending on said error voltage; and comparison signal generating means supplied with said oscillating signal from said voltage controlled oscillator, for generating said N phase comparison signals, said comparison signal generating means comprising frequency dividing and phase splitting means for generating N second phase split signals whose fundamental waves have each a frequency that is 1/m times the frequency of said frequency-multiplied signal, said N second phase split signals having N phases which are split at equal intervals within $\pi$ radians and are respectively shifted from the N phases of said N first phase split signals for $\pi/2$ radians, said N phase detectors being supplied with said N second phase split signals as the phase comparison signals; and N being equal to m, and the alternating current component of said error signal having a fundamental frequency that is 2m times the frequency of said input signal.

5. A phase-locked loop circuit as claimed in claim 4 in which said phase splitting circuit comprises a phase shifting circuit for shifting the phase of said input signal for $\pi/2$ radians, an adding circuit for adding an output signal of said phase shifting circuit and said input signal, a subtracting circuit for performing a subtraction between the output signal of said phase shifting circuit and said input signal, a first output terminal for outputting said input signal as it is, a second output terminal for outputting an output signal of said adding circuit through a first level matching resistor, a third output terminal for outputting the output signal of said phase shifting circuit, and a fourth output terminal for outputting an output signal of said substracting circuit through a second level matching resistor, said first through fourth output terminals outputting four first phase split signals which have four split phases.

6. A phase-locked loop circuit as claimed in claim 4 in which said frequency dividing and phase splitting means comprises a first ½-frequency divider supplied with said frequency-multiplied signal, a second ½-frequency divider cascaded with said first ½-frequency divider and supplied with an output signal of said first ½-frequency divider, a first exclusive OR circuit supplied with said frequency-multiplied signal and the output signal of said first ½-frequency divider, a second exclusive OR circuit supplied with the output signals of said first ½-frequency divider and of said second ½-frequency divider, a third ½-frequency divider supplied with an output signal of said first exclusive OR circuit, a third exclusive OR circuit supplied with the output signal of said first exclusive OR circuit and an output signal of said third ½-frequency divider, a first output terminal for outputting the output signal of said second ½-frequency divider, a second output terminal for outputting the output signal of said third ½-frequency divider, a third output terminal for outputting an output signal of said second exclusive OR circuit, and a fourth output terminal for outputting an output signal of said third exclusive OR circuit, said first through fourth output terminals outputting four second phase split signals which have four split phases.

* * * * *